United States Patent
Batarekh

(10) Patent No.: US 6,385,759 B1
(45) Date of Patent: May 7, 2002

(54) METHOD FOR REDUCING MEMORY REQUIREMENTS IN STATIC TIMING ANALYSIS

(75) Inventor: Camille Batarekh, Wayland, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/495,465

(22) Filed: Feb. 1, 2000

(51) Int. Cl.[7] ............................................... G06F 17/50
(52) U.S. Cl. ............................................... 716/6; 716/2
(58) Field of Search ............................... 714/33; 716/2, 716/5, 6

(56) References Cited

U.S. PATENT DOCUMENTS 6,158,022 A  * 12/2000 Avidan ........................ 714/33

* cited by examiner

Primary Examiner—Matthew Smith
Assistant Examiner—Thuan Do

(74) Attorney, Agent, or Firm—Crosby, Heafey, Roach & May

(57) ABSTRACT

A method used inside a static timing analyzer, or any timing-driven tool, to reduce the memory required to store the timing values. A static timing analyzer stores the arrival times and the required times at every pin of a digital circuit design. As circuit density increases, the number of pins increases proportionately. In order to be able to handle such large designs it is desirable to keep the memory requirement to a minimum, without compromising the performance. The technique presented herein produces significant memory requirement reduction for design with multiple clocks, or multi-cycle paths, with very little performance penalty. In a preferred embodiment of the invention, the method is carried out by the steps of:

1) Setting and propagating source triggering edges forward;
2) Determining target triggering;
3) Propagating the target triggering edges backward;
4) Determining the propagation bins; and
5) Finding a timing values translation function.

24 Claims, 7 Drawing Sheets

METHOD FOR REDUCING MEMORY REQUIREMENTS IN STATIC TIMING ANALYSIS

BACKGROUND OF THE INVENTION

1. Field of the Invention

This invention is generally pertinent to the field of Static Timing Analysis.

2. Description of the Background Art

Static Timing Analysis is the process of verifying the timing correctness of a digital circuit during one clock cycle, without the need for simulation. A longest path analysis and a shortest path analysis are performed on the combinational logic that spans between a launching register and a capturing register in order to determine, in the worst case, whether a signal arrives during the active pulse of a clock.

For example, consider the path spanning between the Q1 output of flip-flop FF1 and the D2 input of flip-flop FF2, in FIG. 1. Assuming that both flip-flops are rising edge triggered, the data will be launched by Clk1 at time 0, and will captured by Clk2 at time 15. The arrival and required times at terminals Q1 and D2 will be stored in memory as follows: Arr(Q1)=0, Arr(D2)=12, Req(Q1)=3, and Req (D2)=15.

A timing analyzer maintains the arrival time and the required time at each terminal. These are stored for both Rise and Fall transitions as well as Late and Early mode. Assuming a floating point number is used for each of the timing values, there is a need for eight floats at each pin of the design. This number is even higher for designs with multiple clocks, because multiple arrival/required times (one for each source clock) may be needed.

In multiple clock designs, it is important to keep track of the triggering clock edges at the source and target flip-flops of each path. This allows the timer to compute the total time allowed for a path. For example, in FIG. 1, if FF2 were triggered by Clk1 then the allowed time for the path becomes, Req(D2)=30, instead of 15.

In a timing analyzer, the design is represented by an acyclic directed graph. In this timing graph, nodes represent pins in the design and edges represent delays along nets and library cells. Arrival times are propagated forward in the timing graph from primary inputs or flip-flop outputs, to primary outputs or flip-flop inputs. At each intermediate pin in the design, the arrival times are combined by picking the most dominant. This is complicated by the presence of multiple clocks, since arrival times emanating from different clocks cannot be combined, unless the source and target clock relationship is analyzed a priori. This analysis is not trivial and constitutes the core of the present invention.

For all timing analyzers the Applicant is presently aware of, (including IBM's Einstimer and Cadence's Pearl(3)), paths starting with different clock edges are analyzed separately. This can be done in two ways. The first approach is to traverse the timing graph several times, one for each clock source edge. The second approach is to traverse the network once and combine the arrival times in several bins according to their clock source edges.

The two approaches constitute a trade-off between performance and memory requirement. The first approach, relinquishes the memory of paths that have been traversed, however it is inefficient since some sub_paths will have to be traversed several times; one for each source triggered by a different clock edge. Another shortcoming of this approach is that it cannot be used in timing driven-tools environment, (such as incremental timing during logic synthesis), where timing values need to be kept in memory at all times in order to be updated. The second approach is efficient, however, the memory required to store the timing values in separate bins could grow significantly.

SUMMARY OF THE INVENTION

The technique of the present invention combines the benefits of the two approaches described above. Arrival times are propagated and combined by traversing the network only once, while the memory required is kept to a minimum. Two additional initialization traversals are also needed. This technique will be described in detail hereinafter, however an example is given below in order to illustrate the difference between it (FIG. 3), and the available art (FIG. 2).

Both FIG. 2 and FIG. 3 show the propagation of arrival and required time on a simple design with two timing paths: path1, Q1-A-Y-D3 is triggered by Clk1, and path2, Q2-B-Y-D3 is triggered by Clk2. Clk2 is similar to Clk1 except that it is shifted in time. For the sake of clarity the following simplifying assumptions will be made: 1) The net delays are zero, and the gate delays for both timing segments (A–Y and B–Y) are equal to one time unit; 2) The flip-flops are rising edge triggered; and 3) Arrival/Required times are stored on the nets rather than pins.

FIG. 2 shows the propagation of arrival and required times along the two paths, according to the method of the available art. The propagation of arrival/required times on path1 and path2, are kept separate. Path1 times are with respect to Clk1, and path2 times are with respect to Clk2. At the output of the AND gate (y), the arrival times are not combined and therefore two separate bins are needed. Note that the required time at pin D3 is different for path1 than for path2 because of the different source-to-target clock relationship, as shown in the timing diagram of FIG. 2. Note that the slack is defined as the difference between the required and arrival times, and is not stored in memory.

FIG. 3 shows the propagation of arrival and required times according to the inventive technique. Instead of carrying the timing values of the common sub-path (Y-D3) separately, they are merged into one arrival/required with respect to Clk2 (the common target clock for both paths). The invention provides a step which indicates how to choose, at each pin in the design, the clock edge with respect to which timing values should be represented. In order to combine the arrival times of both paths at pin Y, the arrival time at pin A needs to be adjusted before it can be propagated to pin Y. Similarly, the required time at pin Y needs adjustment before propagation to pin A.

It is clear from this example that the advantage of this technique is the memory saved at pins Y and D3. This is done at the expense of a minor overhead in converting the timing values from one clock base to another.

The advantage of this invention over the prior art is that it combines the benefits of the two approaches referred to above. It provides a technique for reducing the memory required to store the timing values needed to perform a static timing analysis without the overhead of having to traverse the network repetitively for each clock source edge. The inventive technique produces significant savings for designs with multiple clocks, and it works even in the presence of multi-cycle paths. The technique does not however, reduce the memory required for designs in which all the flip-flops are clocked by the same edge of a single clock.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

Figure 1A:
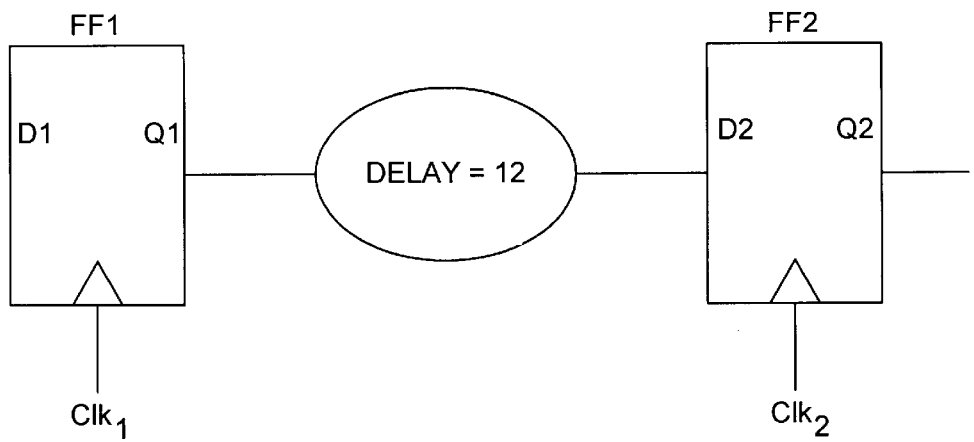
FIG. 1A is a simple latch interface drawing of the prior art.
Figure 1B:
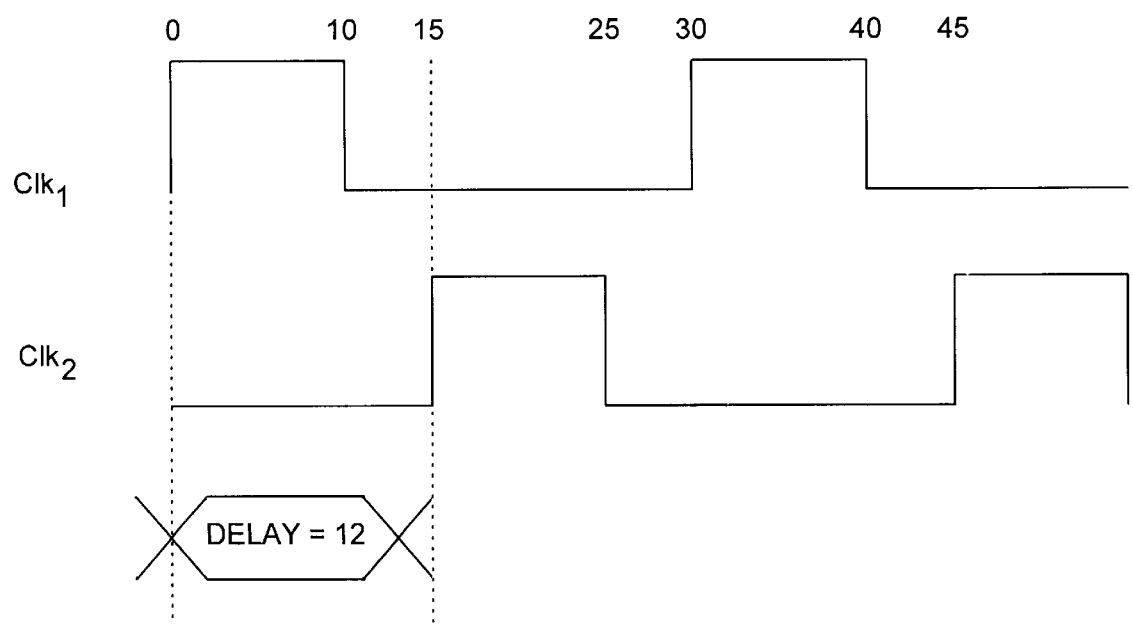
FIG. 1B is a timing diagram latch interface of FIG. 1A.
Figure 2A:
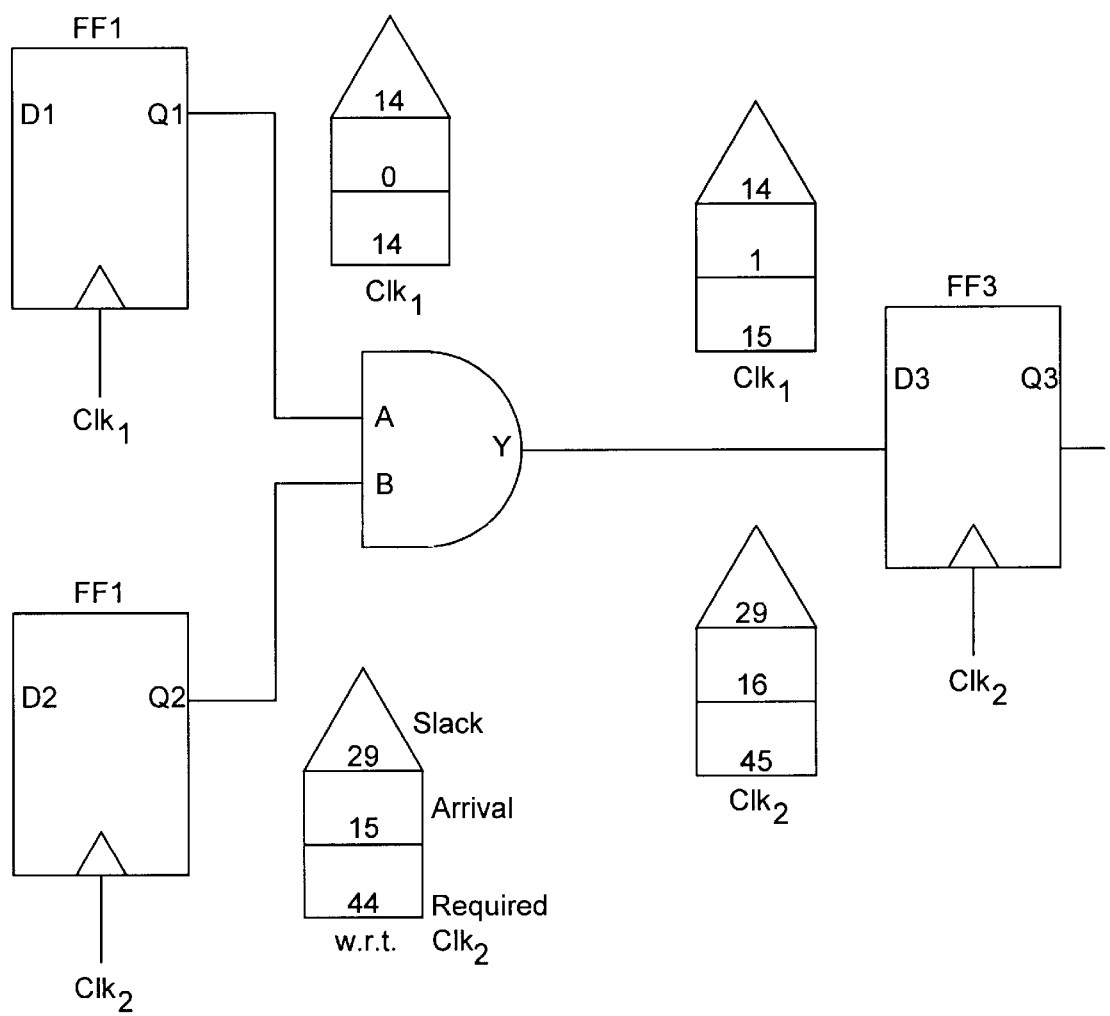
FIG. 2A is a prior art approach to multi-clock timing.
Figure 2B:
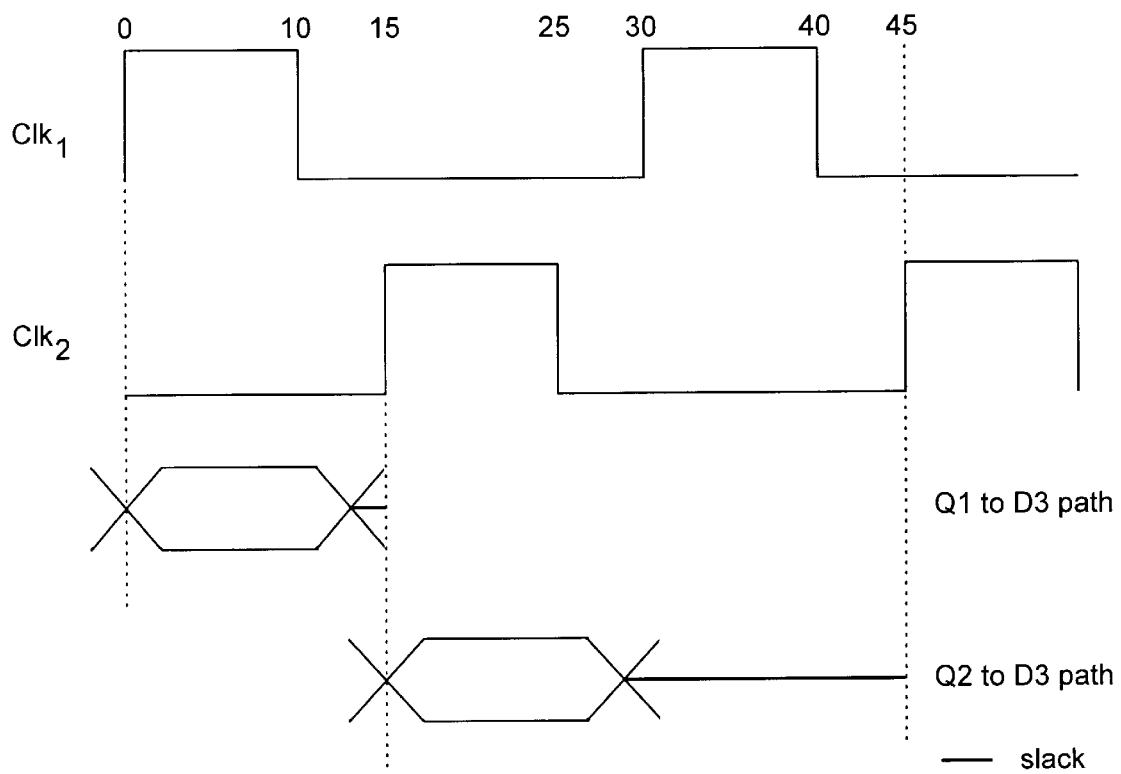
FIG. 2B is a timing diagram for FIG. 2A.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE PREFERRED AND ALTERNATIVE EMBODIMENTS

The inventive technique can be used inside a static timing analyzer, or any timing-driven tool, to reduce the memory required to store the timing values. This is achieved with a minor overhead in performance. First some needed definitions are presented. The steps of the new technique are then described, followed by an indication of potential memory savings.

Definitions

A clock is represented by a triplet (r, f, p), where r is the rise time, f is the fall time, and p is the period. The inverse of a clock C(r, f, p), is also represented by a triplet C' (r', f', p'), where r'=f, f'=r, and p'=p.

A triggering edge is represented by a quadruplet TE(C, e, n, m) where C is a clock (as defined above), e determines the rising or falling edge, n is the edge number (starting with 0 rising and falling edges are numbered separately), and m is a multi-cycle multiplier. For example, the first falling edge of clock C1, is represented by TE1(C1, Fall, 0, 0), and the second rising edge of clock C2 is represented by TE2(C2, Rise, 1, 0). The triggering edge time (TET) is defined as follows:

$$TET(C, e, n, m) = \begin{cases} r + np; & \text{if } (e = \text{rise}) \\ r + np; & \text{if } (e = \text{fall}) \end{cases}$$

where:

1) C is a clock (r,f,p);
2) n is an integer such that $0 \leq n \leq [(SCMP)/p]$; and
3) SCMP is the smallest common multiplier of all clock periods in the design ("smallest common multiplier period").

For the example above, $$TET1 = 10 + (0*30) = 10,$$

and $$TET2 = 5 + (1*20) = 25.$$

Figure 4:
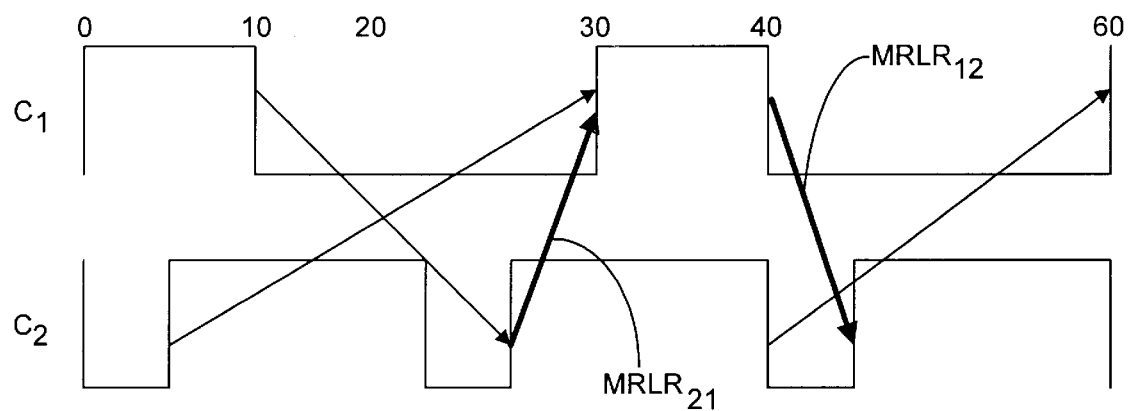
FIG. 4 is a graphical illustration of multi-frequency clocks.

The most restrictive long oath relationship (MRLR) between two clock edges is the minimum time between the time the signal is launched and the time it is captured. Formally, MRLR((C1, e1), C2, e2)) is the minimum non-negative time between any e1 edge of C1 and any e2 edge of C2. For example, MRLR ((C1, Fall), (C2, Rise))=5, and MRLR ((C2, Rise), (C1, Fall))=5 as shown in FIG. 4, by $MRLR_{12}$, and $MRLR_{21}$ respectively. Note that in general MRLR is not a symmetrical function; i.e. MRLR ((C1, e1), (C2, e2) may be different than MRLR ((C2, e2), (C1, e1)). A similar relationship can be defined for short paths.

Steps of a Presently Preferred Embodiment

Step 1. Setting And Propagating Source Triggering Edges Forward

Starting from each end of each path, traverse in a "depth first" search until a beginning of path is reached. Set the triggering edge, TE(C, e, n, m) at the beginning of the path to the following: If the beginning pin is a primary input, set C and e from the user set constraints, otherwise if it is a flip-flop output then set C to the clock driving that FF. Set to Rise/Fall depending on whether the FF is Rising- or Falling-edge triggered, respectively. Check whether the path just traversed is a multi-cycle path; if it is, then set m to the number of cycles, otherwise set it to 0. Always set n to 0 thus, picking the first edge of the clock. Propagate forward the list of clock source triggering edges. For example, in FIG. 5 the propagation of the clock source indexes are shown at each net, (second floor of the house-like shapes). Only the indexes are shown, since it is assumed for simplicity that all the flip-flops are rising edge and that no multi-cycle paths exist.

Step 2. Determining Target Triggering Edges

Once the incoming list of source triggering edges is known at the input of the target flip-flops, the next step is determining the target triggering edges. For a target flip-flop triggered by clock TC(r, f, p), and with an incoming list of N source triggering edges {TE1, ..., TEN}, will be assigned a triggering edge TE(C, e, n, m) at its input, as follows: If the target flip-flop is rising edge then e=Rise else e=Fall. The multi-cycle multiplier is always zero for target edges (m=0). The edge number n is set to the first edge of clock C that is bigger than any triggering edge time of all incoming edges. Therefore n will be set to the equation below:

$$TET(C,e,0,0)+np>MAX(TET_1, \ldots, TET_N)$$

$$n = \frac{\lceil MAX(TET_1, \ldots, TET_N) - TET(C, e, 0, 0)\rceil}{P}$$

Figure 5:
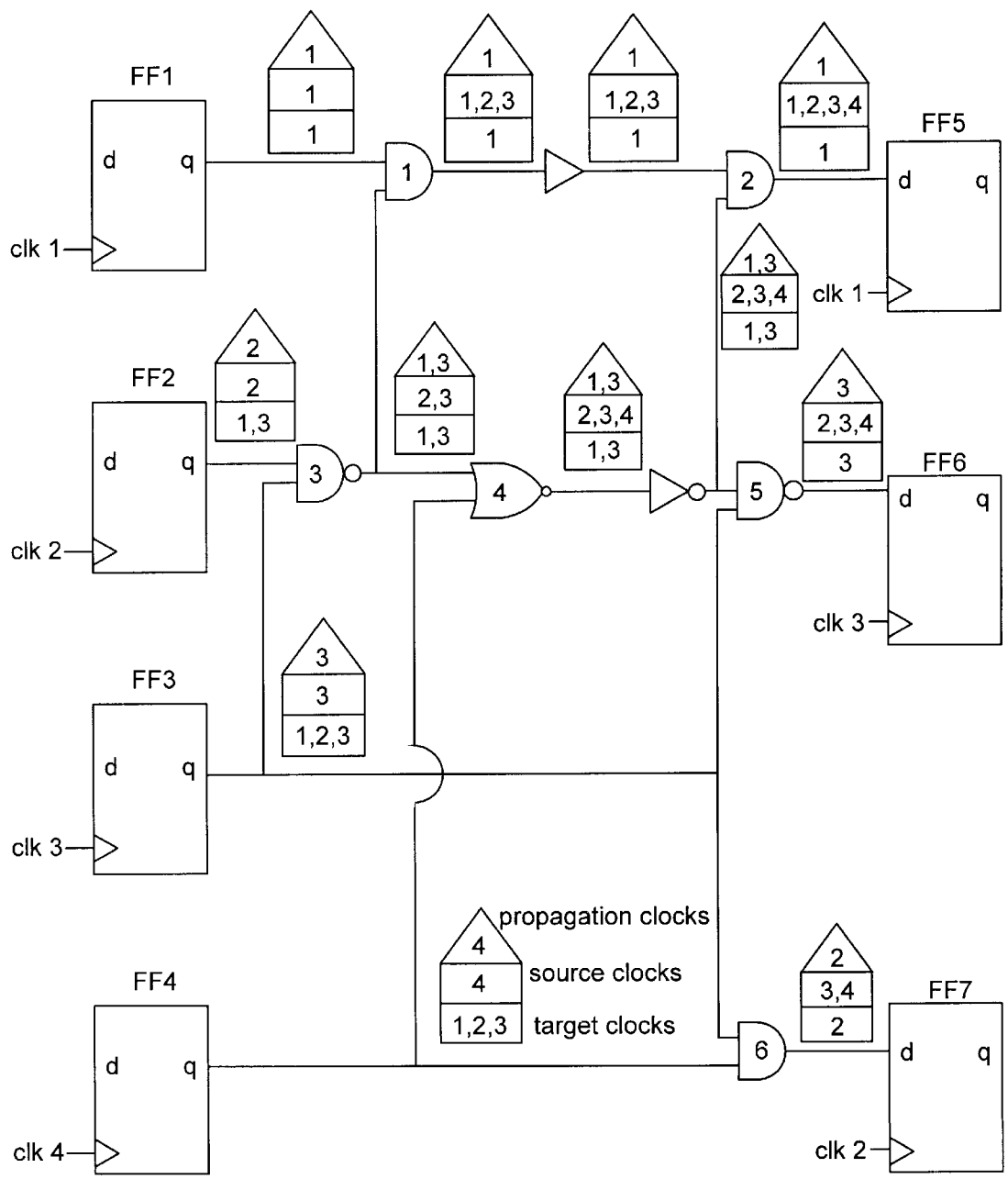
FIG. 5 is a logic circuit diagram illustrating the step of propagation of clock source and target edges used in the present invention.

For example, the triggered edge (TE) at the input d of FF5 in FIG. 5 will be computed as follows: Assume that the four clocks of the design are clk1(0, 10, 100), clk2 (20, 30, 100), clk3(40, 50, 100), and clk4(60, 70, 100). The list of source triggering edges at d is {TE1(clk1, Rise, 0, 0), TE2(clk2, Rise, 0,0), TE3(clk3, Rise, 0, 0), TE4(clk4, Rise 0,0)}, where n=ceiling [(MAX(0, 20, 30, 60)−0)/100=1.

Step 3. Propagating The Target Triggering Edges Backward

Once the triggering edge is known at every input of a flip-flop, it is propagated backward in the timing graph, and collected at each node. This is shown in FIG. 5, at every net of the design, by the list stored in the first floor of the house.

Step 4. Determining the Propagation Bins

At each pin of the design, determine the minimum number of triggering edges. Each triggering edge found represents an index to a bin that would store all the arrival and required times with respect to that TE. The list of TEs is set to the smallest of the list of source TEs, and the list of target TEs; in case of a tie the list of target TEs preferably win. In the example of FIG. 5, the list of propagation bins is shown in the roof of the house.

Step 5. Finding Timing Values Translation Function

Figure 3A:
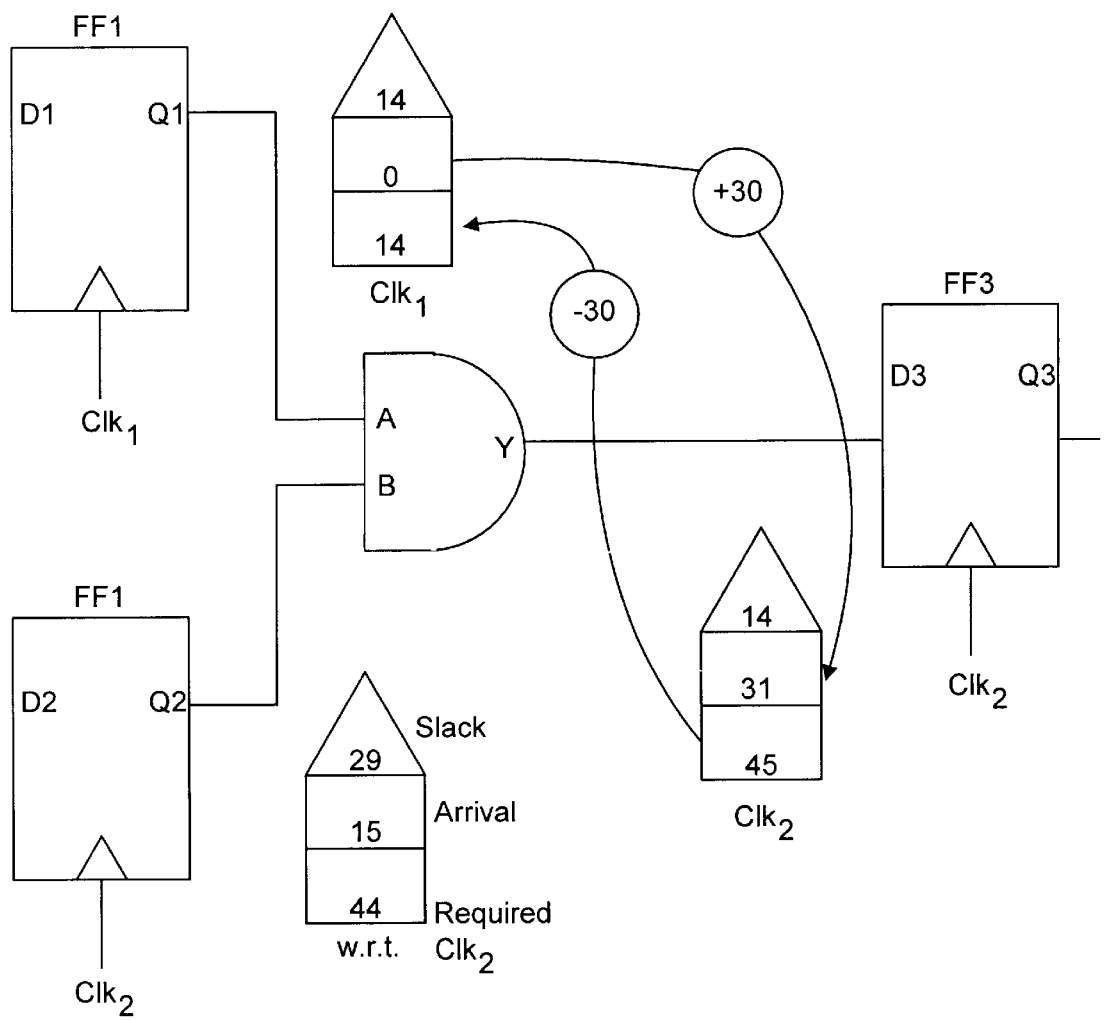
FIG. 3A is a simple illustration of the inventive approach of multi-clock timing.
Figure 3B:
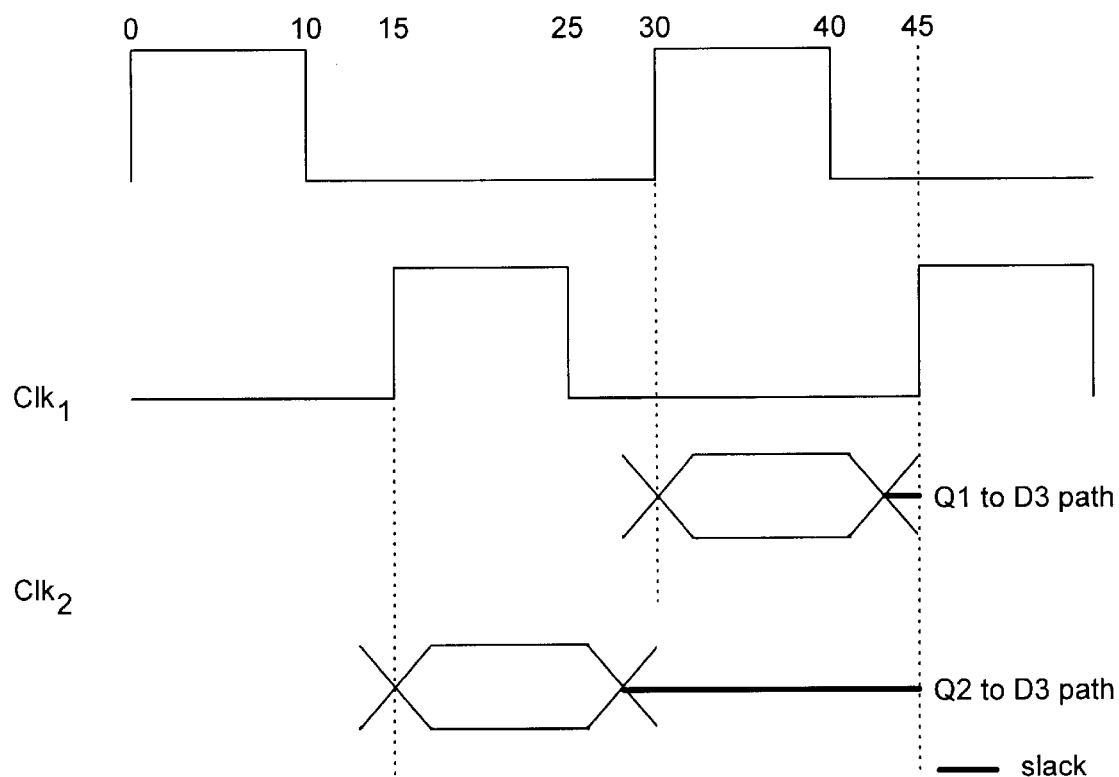
FIG. 3B is a timing diagram for FIG. 3A.

The final step is to find a translation function that allows the translation of a timing value from one TE base to another. This is needed because the bins along a timing path may no longer be with respect to the same TE base, and therefore arrival and required times may have to be translated before they are propagated, (as shown in path1 of FIG. 3). Additionally, the translation function can handle multi-frequency, as well as multi-cycle paths. The following is a function that translates a time t1 with regard to TE1, to a time t2 with regard to TE2:

Translate $Arr(t, TE1(C1, e1, n1, m1), t2, TE2(C2, e2, n2, m2))\{t2=t1+TET2-TET1-MRLR((C1, e1), (C2, e2))-p1*m1\}$ For example, consider path 1 of FIG. 3. The arrival time at pin A with regard to Clk1 has to be translated to an arrival time with regard to Clk2 before it can be combined and stored at pin Y. FIG. 3 shows an adjustment of 30. This is computed by applying the translation function as follows:

Translate $Arr(t1, TE1(Clk1, Rise, 0, 0), t2, TE2(Clk2, Rise, 1, 0))\{t2=t1+45-0-15-(30*0)=t1+30\}$ An arrival time is translated into a new TE base only if a bin with respect to the old TE base does not exist. For example, given a logic gate for which the arrival times at its inputs are with regard to TE1 and TE2, and the arrival times at its input are with regard to TE1 and TE3. The input arrival time with regard to TE1 need not be translated before its propagation to the output of the gate, since a bin with regard to TE1 exists at the output. The input arrival with regard to TE2 will have to be translated to both TE1 and TE3 base before it can be propagated.

Memory Saving

The memory savings provided by the present invention depends on the topology of the underlying graph, as well as the number of clocks involved. Intuitively it is apparent that a substantial memory savings would result from this technique. The overhead is a by-product of the translation function described above. Note that the MRLR's are pre-computed functions that do not add to the performance overhead. In FIG. 5, the available method would require 104 bins in order to store the timing values at all the pins of the design. The method of the present invention reduces that number to 71, a memory savings of 31.7%.

The present invention therefore provides a novel method for reducing the memory capacity requirement for static timing analysis. Although the present invention has been shown and described with respect to preferred embodiments, various changes and modifications lie within the spirit and scope of the claimed invention. Thus, the corresponding structures, materials, acts, and equivalents of all means or step plus function elements in the claims in this patent application or any applications claiming priority therefrom are intended to include any structure, material, or acts for performing the functions in combination with other elements as specifically claimed.

What is claimed is:

1. In a logic circuit having a plurality of gate paths leading from a plurality of input flip-flops to a plurality of output flip-flops, at least some of said input and output flip-flops being triggered by a triggering edge of a first clock and at least some of said input and output flip-flops being triggered by a triggering edge of a second clock, said first and second clocks having a smallest common multiplier period (SCMP);

a method for reducing the memory capacity requirement for static timing analysis; the method comprising the steps of:

a) starting at the output flip-flop end of each said path, conducting a depth first search to the input end of each said path to set said triggering edges at respective input flip-flops to TE(C,e,n,m) where C=the clock number defined by its rise time, fall time and period; e=rise or fall depending on whether the respective flip-flop is rising edge triggered or falling edge triggered; n is an edge number and n=O and m=number of cycles in multi-cycle path or zero if path is not multi-cycle and propagating the list of input flip-flop triggering edges to the output flip-flop inputs;

b) determining output triggering edges at said output flip-flops wherein for each such output flip-flop having an incoming list of N input flip-flop triggering edges ($TET_1 \ldots TET_N$), assigning a triggering edge ($n_{te}$) from said list by calculating $$n_{te} = \frac{[MAX(TET_1, \ldots, TET_N) - TET(C, e, 0, 0)]}{p}$$

where triggering edge time (TET) is defined as $$TET(C, e, n, m) = \begin{cases} r + np; & \text{if } (e = \text{rise}) \\ r + np; & \text{if } (e = \text{fall}) \end{cases}$$

where: C is a clock (r,f,p), $0 \leq n \leq (SCMP)/p$, and p is clock period; and c) propagating said output triggering edges backward in the form of a list at each net of all said paths.

2. The method recited in claim 1 further comprising the step of:

d) determining the minimum number of triggering edges at each pin by selecting the smaller list of the list of input flip-flop triggering edges and output triggering edges and by selecting the list of output triggering edges if equal in size to the corresponding input flip-flop list of triggering edges.

3. The method recited in claim 2 further comprising the step of:

e) finding a translation function that allows translation of a timing value from one triggering edge base to another triggering edge base regardless of multi-frequency and multi-cycle paths.

4. In a logic circuit having a plurality of gate paths leading from a plurality of input flip-flops to a plurality of output flip-flops, at least some of said input and output flip-flops being triggered by a triggering edge of a first clock and at least some of said input and output flip-flops being triggered by a triggering edge of a second clock, said first and second clocks having a smallest common multiplier period (SCMP);

a method for converting a timing value from one timing edge base to another; the method comprising the steps of:

a) starting at the output flip-flop end of each said path, conducting a depth first search to the input end of each said path to set said triggering edges at respective input flip-flops to TE(C,e,n,m) where C=the clock number defined by its rise time, fall time and period; e=rise or fall depending on whether the respective flip-flop is rising edge triggered or falling edge triggered; n is an edge number and n=O and m=number of cycles in multi-cycle path or zero if path is not multi-cycle and propagating the list of input flip-flop triggering edges to the output flip-flop inputs;

b) determining output triggering edges at said output flip-flops wherein for each such output flip-flop having an incoming list of N input flip-flop triggering edges ($TET_1 \ldots TET_N$), assigning a triggering edge ($n_{te}$) from said list by calculating $$n_{te} = \frac{\lceil MAX(TET_1, \ldots, TET_N) - TET(C, e, 0, 0) \rceil}{p}$$

where triggering edge time (TET) is defined as $$TET(C, e, n, m) = \begin{cases} r + np; & \text{if } (e = \text{rise}) \\ r + np; & \text{if } (e = \text{fall}) \end{cases}$$

where: C is a clock (r,f,p), and $0 \leq n \leq (SCMP)/p$, and p is clock period; and c) finding a translation function that allows translation of a timing value from one triggering edge base to another triggering edge base regardless of multi-frequency and multi-cycle paths.

5. A method for static timing analysis of a digital circuit, the circuit having a plurality of source flip-flops and a plurality of target flip-flops and at least two clocks having a smallest common multiplier period (SCMP) one of the clocks triggering at least some of said source flip-flops and the other of said clocks triggering at least some of said target flip-flops, said circuit further having a plurality of logic paths interconnecting said source flip-flops and said target flip-flops; the method comprising the steps of:

a) starting at the target flip-flop end of each said path, conducting a depth first search to the input end of each said path to set said triggering edges at respective source flip-flops to TE(C,e,n,m) where C=the clock number defined by its rise time, fall time and period; e=rise or fall depending on whether the respective flip-flop is rising edge triggered or falling edge triggered; n=O and m=number of cycles in multi-cycle path or zero if path is not multi-cycle and propagating the list of source flip-flop triggering edges to the target flip-flop inputs;

b) determining target triggering edges at said target flip-flops wherein for each such target flip-flop having an incoming list of N source flip-flop triggering edges, assigning a triggering edge ($n_{te}$) from said list by calculating $$n_{te} = \frac{\lceil MAX(TET_1, \ldots, TET_N) - TET(C, e, 0, 0) \rceil}{p}$$

where triggering edge time (TET) is defined as $$TET(C, e, n, m) = \begin{cases} r + np; & \text{if } (e = \text{rise}) \\ r + np; & \text{if } (e = \text{fall}) \end{cases}$$

where: C is a clock (r,f,p), and $0 \leq n \leq (SCMP)/p$, and p is clock period; and c) propagating said target triggering edges backward in the form of a list at each net of all said paths.

6. The method recited in claim 5 further comprising the step of:

d) determining the minimum number of triggering edges at each pin by selecting the smaller list of the list of source flip-flop triggering edges and target triggering edges and by selecting the list of target triggering edges if equal in size to the corresponding source flip-flop list of triggering edges.

7. The method recited in claim 6 further comprising the step of:

e) finding a translation function that allows translation of a timing value from one triggering edge base to another triggering edge base regardless of multi-frequency and multi-cycle paths.

8. A method for converting a timing value from one timing edge base to another for static timing analysis of a digital circuit, the circuit having a plurality of source flip-flops and a plurality of target flip-flops and at least two clocks having a smallest common multiplier period (SCMP) one of the clocks triggering at least some of said source flip-flops and the other of said clocks triggering at least some of said target flip-flops, said circuit further having a plurality of logic paths interconnecting said source flip-flops and said target flip-flops; the method comprising the steps of:

a) starting at the target flip-flop end of each said path, conducting a depth first search to the input end of each said path to set said triggering edges at respective source flip-flops to TE(C,e,n,m) where C=the clock number defined by its rise time, fall time and period; e=rise or fall depending on whether the respective flip-flop is rising edge triggered or falling edge triggered; n is an edge number and n=O and m=number of cycles in multi-cycle path or zero if path is not multi-cycle and propagating the list of source flip-flop triggering edges to the target flip-flop inputs;

b) determining target triggering edges at said target flip-flops wherein for each such target flip-flop having an incoming list of N source flip-flop triggering edges, assigning a triggering edge ($n_{te}$) from said list by calculating $$n_{te} = \frac{\lceil MAX(TET_1, \ldots, TET_N) - TET(C, e, 0, 0) \rceil}{p}$$

where triggering edge time (TET) is defined as $$TET(C, e, n, m) = \begin{cases} r + np; & \text{if } (e = \text{rise}) \\ r + np; & \text{if } (e = \text{fall}) \end{cases}$$

where: C is a clock (r,f,p), and $0 \leq n \leq (SCMP)/p$, and p is clock period; and c) finding a translation function that allows translation of a timing value from one triggering edge base to another triggering edge base regardless of multi-frequency and multi-cycle paths.

9. In a logic circuit having a plurality of gate paths leading from a plurality of input flip-flops to a plurality of output flip-flops, at least some of said input and output flip-flops being triggered by a triggering edge of a first clock and at least some of said input and output flip-flops being triggered by a triggering edge of a second clock, said first and second clocks having a smallest common multiplier period (SCMP);

a method for reducing the memory capacity requirement for static timing analysis; the method comprising the steps of:

a) starting at the output flip-flop end of each said path, conducting a depth first search to the input end of each said path to set said triggering edges at respective input flip-flops and propagating the list of input flip-flop triggering edges to the output flip-flop inputs;

b) determining output triggering edges at said output flip-flops by calculating for each output flip-flop an n clock edge input based on a maximum Triggering Edge Time (TET) of source flip-flop triggering edges and said SCMP;

c) propagating said output triggering edges backward in the form of a list at each net of all said paths.

10. The method recited in claim 9 further comprising the step of:

d) determining the minimum number of triggering edges at each pin.

11. The method recited in claim 10 further comprising the step of:

e) finding a translation function that allows translation of a timing value from one triggering edge base to another triggering edge base regardless of multi-frequency and multi-cycle paths.

12. In a logic circuit having a plurality of gate paths leading from a plurality of input flip-flops to a plurality of output flip-flops, at least some of said input and output flip-flops being triggered by a triggering edge of a first clock and at least some of said input and output flip-flops being triggered by a triggering edge of a second clock, said first and second clocks having a smallest common multiplier period (SCMP);

a method for converting a timing value from one timing edge base to another; the method comprising the steps of:

a) starting at the output flip-flop end of each said path, conducting a depth first search to the input end of each said path to set said triggering edges at respective input flip-flops and propagating the list of input flip-flop triggering edges to the output flip-flop inputs;

b) determining output triggering edges at said output flip-flops by calculating for each output flip-flop an n clock edge input based on a maximum Triggering Edge Time (TET) of source flip-flop triggering edges and said SCMP; and c) finding a translation function that allows translation of a timing value from one triggering edge base to another triggering edge base regardless of multi-frequency and multi-cycle paths.

13. A method for static timing analysis of a digital circuit, the circuit having a plurality of source flip-flops and a plurality of target flip-flops and at least two clocks having a smallest common multiplier period (SCMP) one of the clocks triggering at least some of said source flip-flops and the other of said clocks triggering at least some of said target flip-flops, said circuit further having a plurality of logic paths interconnecting said source flip-flops and said target flip-flops; the method comprising the steps of:

a) starting at the target flip-flop end of each said path, conducting a depth first search to the input end of each said path to set said triggering edges at respective source flip-flops and propagating the list of source flip-flop triggering edges to the target flip-flop inputs;

b) determining target triggering edges at said target flip-flops by calculating for each output flip-flop an n clock edge input based on a maximum Triggering Edge Time (TET) of source flip-flop triggering edges and said SCMP;

c) propagating said target triggering edges backward in the form of a list at each net of all said paths.

14. The method recited in claim 13 further comprising the step of:

d) determining the minimum number of triggering edges at each pin.

15. The method recited in claim 14 further comprising the step of:

e) finding a translation function that allows translation of a timing value from one triggering edge base to another triggering edge base regardless of multi-frequency and multi-cycle paths.

16. A method for converting a timing value from one timing edge base to another for static timing analysis of a digital circuit, the circuit having a plurality of source flip-flops and a plurality of target flip-flops and at least two clocks having a smallest common multiplier period (SCMP) one of the clocks triggering at least some of said source flip-flops and the other of said clocks triggering at least some of said target flip-flops, said circuit further having a plurality of logic paths interconnecting said source flip-flops and said target flip-flops; the method comprising the steps of:

a) starting at the target flip-flop end of each said path, conducting a depth first search to the input end of each said path to set said triggering edges at respective source flip-flops and propagating the list of source flip-flop triggering edges to the target flip-flop inputs;

b) determining target triggering edges at said target flip-flops by calculating for each target flip-flop an n clock edge input based on a maximum Triggering Edge Time (TET) of source flip-flop triggering edges and said SCMP; and c) finding a translation function that allows translation of a timing value from one triggering edge base to another triggering edge base regardless of multi-frequency and multi-cycle paths.

17. In a logic circuit having a plurality of gate paths leading from a plurality of input triggered devices to a plurality of output triggered devices, at least some of said input and output devices being triggered by a triggering edge of a first clock and at least some of said input and output devices being triggered by a triggering edge of a second clock, said first and second clocks having a smallest common multiplier period (SCMP);

a method for reducing the memory capacity requirement for static timing analysis; the method comprising the steps of:

a) starting at the output triggered device end of each said path, conducting a depth first search to the input end of each said path to set said triggering edges at respective input triggered devices and propagating the list of input latch triggering edges to the output triggered device inputs;

b) determining output triggering edges at said output devices by calculating for each output device an n clock edge input based on a maximum Triggering Edge Time (TET) of input device triggering edges and said SCMP;

c) propagating said output triggering edges backward in the form of a list at each net of all said paths.

18. The method recited in claim 17 further comprising the step of:

d) determining the minimum number of triggering edges at each pin.

19. The method recited in claim 18 further comprising the step of:

e) finding a translation function that allows translation of a timing value from one triggering edge base to another triggering edge base regardless of multi-frequency and multi-cycle paths.

20. In a logic circuit having a plurality of gate paths leading from a plurality of input latches to a plurality of output latches, at least some of said input and output latches being triggered by a triggering edge of a first clock and at least some of said input and output latches being triggered by a triggering edge of a second clock, said first and second clocks having a smallest common multiplier period (SCMP);

a method for converting a timing value from one timing edge base to another; the method comprising the steps of:

a) starting at the output latch end of each said path, conducting a depth first search to the input end of each said path to set said triggering edges at respective input latches and propagating the list of input latch triggering edges to the output latch inputs;

b) determining output triggering edges at said output latches by calculating for each output latch end an n clock edge input based on a maximum Triggering Edge Time (TET) of input latch triggering edges and said SCMP; and c) finding a translation function that allows translation of a timing value from one triggering edge base to another triggering edge base regardless of multi-frequency and multi-cycle paths.

21. A method for static timing analysis of a digital circuit, the circuit having a plurality of source latches and a plurality of target latches and at least two clocks having a smallest common multiplier period (SCMP) one of the clocks triggering at least some of said source latches and the other of said clocks triggering at least some of said target latches, said circuit further having a plurality of logic paths interconnecting said source latches and said target latches; the method comprising the steps of:

a) starting at the target latch end of each said path, conducting a depth first search to the input end of each said path to set said triggering edges at respective source latches and propagating the list of source latch triggering edges to the target latch inputs;

b) determining target triggering edges at said target latches by calculating for each target latch an n clock edge input based on a maximum Triggering Edge Time (TET) of source latch triggering edges and said SCMP;

c) propagating said target triggering edges backward in the form of a list at each net of all said paths.

22. The method recited in claim 21 further comprising the step of:

d) determining the minimum number of triggering edges at each pin.

23. The method recited in claim 22 further comprising the step of:

e) finding a translation function that allows translation of a timing value from one triggering edge base to another triggering edge base regardless of multi-frequency and multi-cycle paths.

24. A method for converting a timing value from one timing edge base to another for static timing analysis of a digital circuit, the circuit having a plurality of source triggered devices and a plurality of target triggered devices and at least two clocks having a smallest common multiplier period (SCMP) one of the clocks triggering at least some of said source devices and the other of said clocks triggering at least some of said target devices, said circuit further having a plurality of logic paths interconnecting said source devices and said target devices; the method comprising the steps of:

a) starting at the target device end of each said path, conducting a depth first search to the input end of each said path to set said triggering edges at respective source devices and propagating the list of source device triggering edges to the target device inputs;

b) determining target triggering edges at said target devices by calculating for each target device an n clock edge input based on a maximum Triggering Edge Time (TET) of source device triggering edges and said SCMP; and c) finding a translation function that allows translation of a timing value from one triggering edge base to another triggering edge base regardless of multi-frequency and multi-cycle paths.

* * * * *